(12) United States Patent
Sullivan et al.

(10) Patent No.: US 7,652,465 B2
(45) Date of Patent: Jan. 26, 2010

(54) NO DEAD TIME DATA ACQUISITION

(75) Inventors: Steven K. Sullivan, Beaverton, OR (US); Terrance R. Beale, Portland, OR (US); Kristie Veith, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/388,428

(22) Filed: Mar. 24, 2006

(65) Prior Publication Data
US 2007/0222429 A1    Sep. 27, 2007

(51) Int. Cl.
*G01R 13/20* (2006.01)
(52) U.S. Cl. ............... 324/121 R; 324/76.15; 324/76.24; 324/76.38; 324/76.42; 345/134
(58) Field of Classification Search ............. 324/76.15, 324/76.24, 76.38, 76.42, 121 R; 345/134
See application file for complete search history.

(56) References Cited

U.S. PATENT DOCUMENTS

| | | | | |
|---|---|---|---|---|
| 5,530,454 A * | 6/1996 | Etheridge et al. | ........ | 345/440.1 |
| 5,706,203 A | 1/1998 | Kawauchi | | |
| 5,999,163 A * | 12/1999 | Ivers et al. | ................... | 345/208 |
| 6,188,384 B1 * | 2/2001 | Sullivan et al. | .......... | 345/440.1 |
| 6,195,617 B1 * | 2/2001 | Miller | ....................... | 702/125 |
| 6,275,257 B1 * | 8/2001 | Tallman et al. | .............. | 348/184 |
| 6,278,435 B1 * | 8/2001 | Etheridge et al. | ........ | 345/440.1 |
| 6,466,006 B2 * | 10/2002 | Alexander | .............. | 324/121 R |
| 6,473,701 B1 * | 10/2002 | Tallman et al. | ................ | 702/67 |
| 6,559,868 B2 * | 5/2003 | Alexander et al. | .......... | 715/781 |
| 6,584,419 B1 * | 6/2003 | Alexander | .................... | 702/68 |
| 6,633,297 B2 * | 10/2003 | McCormack et al. | ........ | 345/506 |
| 6,760,673 B2 * | 7/2004 | Genther et al. | ................. | 702/75 |
| 6,847,905 B2 * | 1/2005 | Etheridge et al. | ............. | 702/67 |
| 6,892,150 B2 * | 5/2005 | Pickerd et al. | ................ | 702/67 |
| 7,038,711 B2 * | 5/2006 | Albright | ..................... | 348/180 |
| 2003/0208328 A1 | 11/2003 | Pickerd | | |
| 2003/0220753 A1 | 11/2003 | Pickerd et al. | | |

FOREIGN PATENT DOCUMENTS

| EP | 0677746 A | 10/1995 |
|---|---|---|
| EP | 1156338 A | 11/2001 |

* cited by examiner

*Primary Examiner*—Minsun Harvey
*Assistant Examiner*—Yuanda Zhang
(74) *Attorney, Agent, or Firm*—Francis I. Gray; Thomas F. Lenihan

(57) ABSTRACT

A "no dead time" data acquisition system for a measurement instrument receives a digitized signal representing an electrical signal being monitored and generates from the digitized signal a trigger signal using a fast digital trigger circuit, the trigger signal including all trigger events within the digitized signal. The digitized signal is compressed as desired and delayed by a first-in, first-out (FIFO) buffer for a period of time to assure a predetermined amount of data prior to a first trigger event in the trigger signal. The delayed digitized signal is delivered to a fast rasterizer or drawing engine upon the occurrence of the first trigger event to generate a waveform image. The waveform image is then provided to a display buffer for combination with prior waveforms and/or other graphic inputs from other drawing engines. The contents of the display buffer are provided to a display at a display update rate to show a composite of all waveform images representing the electrical signal.

7 Claims, 2 Drawing Sheets

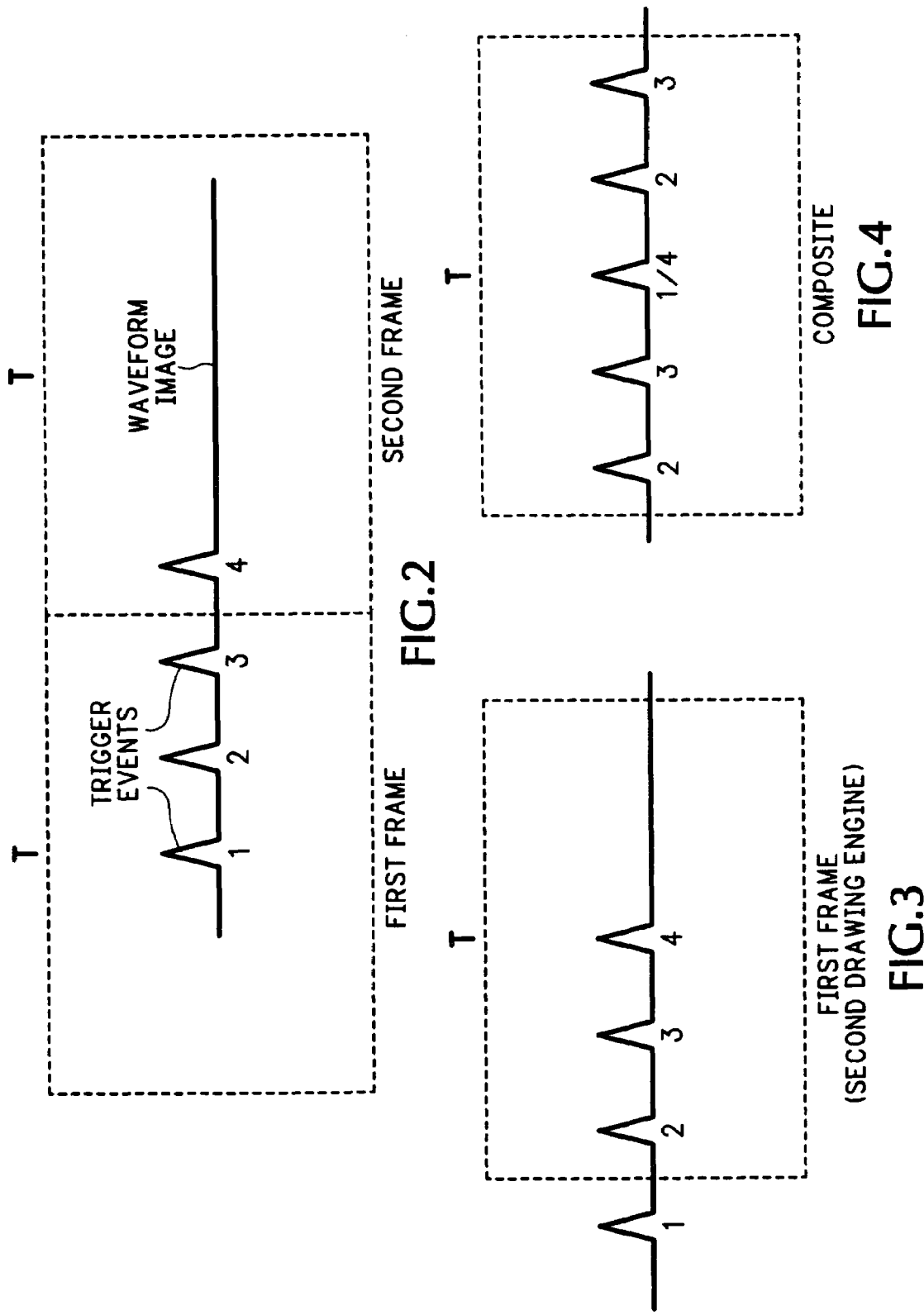

NO DEAD TIME DATA ACQUISITION

BACKGROUND OF THE INVENTION

The current invention relates to data acquisition, and more particularly to "no dead time" data acquisition for measurement instruments, such as oscilloscopes.

The "dead time" of a measurement instrument, such as an oscilloscope, is a time when data acquisition circuitry does not respond to a valid trigger event by displaying a waveform representing an electrical signal being monitored. In an analog oscilloscope, for example, dead time occurs during beam retrace time on a cathode ray tube. In a digital oscilloscope dead time often occurs when the instrument is busy with a number of tasks, i.e., not able to process a trigger when a previously acquired waveform is being read from an acquisition memory or when it is busy drawing the acquired data to make an image of the waveform for display. Electronic circuits occasionally work in an unexpected manner. The incorrect operation may be rare, perhaps occurring once in thousands of correct cycles of operation. Fast circuits that cycle quickly often operate at rates much faster than a standard digital oscilloscope can display the corresponding waveforms. The typical digital oscilloscope ignores most of the triggers because it is busy processing and drawing waveforms. The waveforms that show the incorrect operation of the circuit may be missed, i.e., may not be acquired. An oscilloscope user may have to wait a long time in order to view the incorrect operation. Even though incorrect circuit operation may not be visible, the oscilloscope user may not ever have confidence that the circuit is working properly since only a small fraction of the waveforms are drawn on the oscilloscope display. The basic digital oscilloscope has an architecture in which data is received in an acquisition memory, and then acquisition is halted by a trigger event while the acquisition memory is read and the waveform drawing is performed.

What is desired is continuous drawing of the waveform of an electrical signal so that incorrect operation of an electronic circuit being monitored, if present, is guaranteed to be drawn on the display.

BRIEF SUMMARY OF THE INVENTION

Accordingly the present invention provides a "no dead time" data acquisition system for a measurement instrument by receiving a digitized signal representing an electrical signal being monitored and generating from the digitized signal a trigger signal using a fast digital trigger circuit, the trigger signal including all trigger events within the digitized signal. The digitized signal is compressed as desired and delayed by a first-in, first-out (FIFO) buffer for a period of time to assure a predetermined amount of data prior to a first trigger event in the trigger signal. The delayed digitized signal is delivered to a fast rasterizer or drawing engine upon the occurrence of the first trigger event to generate a waveform image. The waveform image is then provided to a display buffer for combination with prior waveform images and/or other graphic inputs from other drawing engines. The contents of the display buffer are provided to a display at a display update rate to show a composite of all waveform images representing the electrical signal. Two or more drawing engines may be used for each input channel of the measurement instrument to produce two or more waveform images, each waveform image having one of the trigger events at a specified trigger position within a display window. The waveform images are combined to form a composite waveform image containing all the trigger events for combination with the previous waveform images in the display buffer and/or with graphics from other drawing engines. For certain trigger positions within the display window an indicator is provided to show that a trigger event may have been missed. Also when there are no trigger events, a graphic of the signal content may still be provided for the display.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 2 is a graphic display view of a waveform image including trigger events according to the present invention.

FIG. 3 is a graphic display view of a portion of a waveform image using a second drawing engine according to the present invention.

FIG. 4 is a graphic display view of a composite waveform image formed by multiple drawing engines according to the present invention.

DETAILED DESCRIPTION OF THE INVENTION

Figure 1:
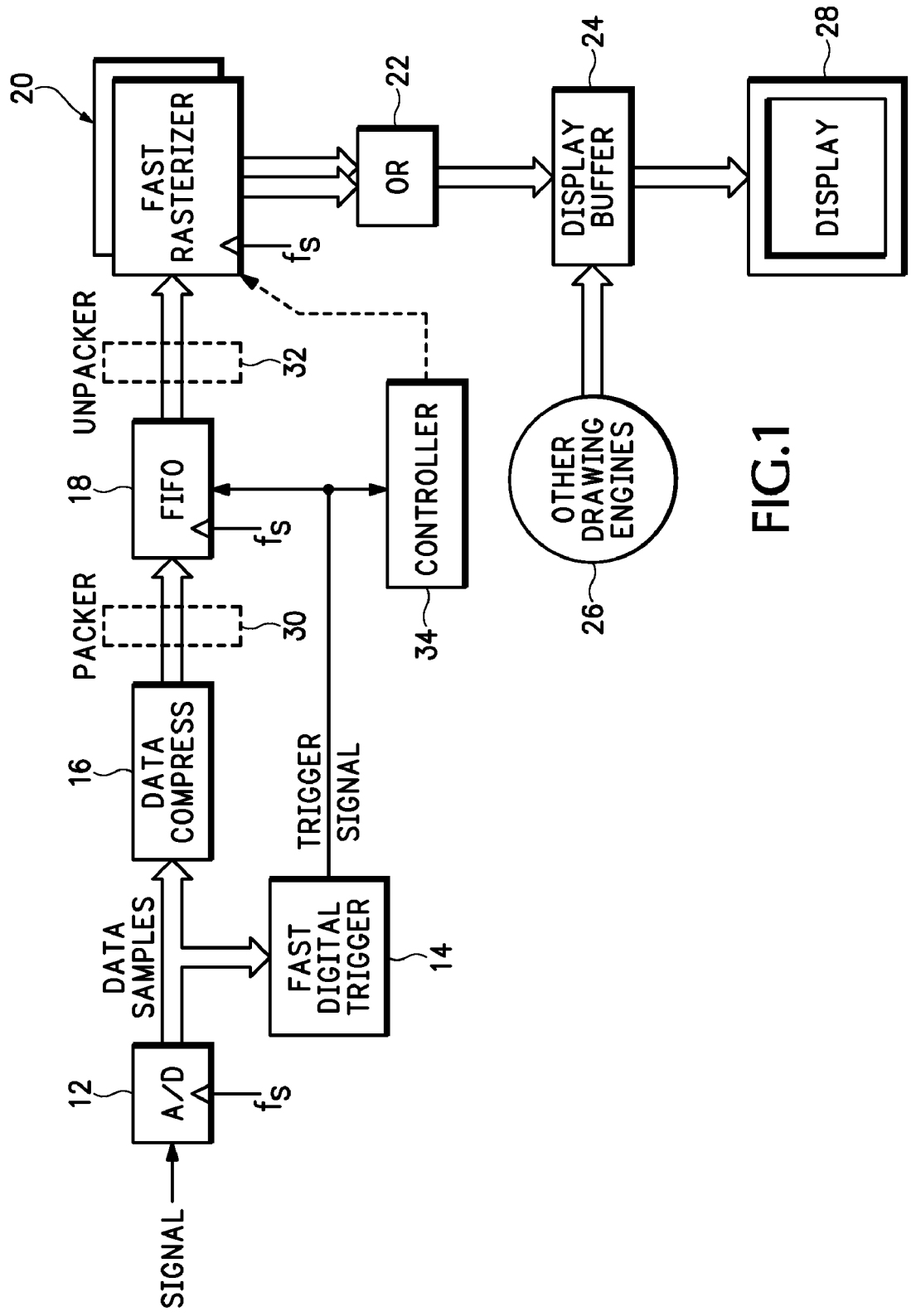
FIG. 1 is a block diagram view for "no dead time" data acquisition according to the present invention.

Referring now to FIG. 1 a digital data acquisition architecture for a measurement instrument, such as a digital oscilloscope, is shown that allows every valid trigger event to be displayed. There are four requirements to make "no dead time" possible, which are described below. By definition "no dead time" means all trigger events are shown on a display screen, every waveform image associated with the trigger events has a trigger event at a specified trigger location T on the display screen, and it is not necessary (or desirable) to display all trigger events at the specified trigger location.

Every trigger event must be detected, even when trigger events arrive at the full bandwidth of the measurement instrument, so fast trigger recognition is required. In addition to recognizing each trigger event, the time of each trigger event relative to the acquired data must be computed. Therefore the signal being monitored is converted by an analog-to-digital converter (ADC) 12 to digital data samples to produce a digitized signal, and the digitized signal is input to a digital trigger circuit 14 such as the one described in co-pending U.S. patent application Ser. No. 11/388,925 entitled "Improved Digital Trigger." Although the description herein discusses digital trigger generation, an analog trigger circuit that captures all trigger events may also be used.

The digitized signal from the ADC 12 is also input to a data compressor 16 to reduce the amount of data for storage without losing any significant features of the signal. Digital measurement instruments need to be able to draw a portion of the digitized signal before a trigger event. Therefore the digitized signal is delayed by input to a first-in, first-out (FIFO) buffer 18 that allows a specified amount of data prior to the trigger event to be stored, i.e., pre-trigger data. A similar FIFO 18 is described in U.S. Pat. No. 5,706,203 entitled "Waveform Measuring Apparatus for Easily Providing Pretrigger Function by Using FIFO Memory." The FIFO 18 delays the digitized signal so that, after the trigger event is detected, the first data to be drawn is delivered to a waveform drawing engine 20 from the FIFO.

The output of the FIFO 18 is sent directly to the waveform drawing engine 20, at the center of which is a custom memory as described in co-pending U.S. patent application Ser. No. 11/393,129 entitled "Fast Rasterizer." Each bit in the custom memory corresponds to a pixel in a black-and-white image of the waveform. The custom memory is built so that in one clock cycle at the fastest drawing rate an N-column wide image of the waveform may be drawn in the custom memory. This allows the waveform image to be drawn as fast as the data samples of the digitized signal are acquired.

A final step in generating a display for a measurement instrument with no dead time is to duplicate the drawing engine 20 so that more than one waveform image may be drawn at the same time. As shown in FIG. 2 a simulated waveform image is shown having a first trigger event (indicated by a pulse) at the specified trigger position on the display, with subsequent trigger events following. If there are only three trigger events, the first display frame satisfies the no dead time requirement as all trigger events are shown and one of the trigger events is at the specified trigger position. However when there is a fourth trigger event that is not included in the first frame, a second frame is required to capture this last trigger event. Restarting a single drawing engine as soon as it finishes the first frame produces all the trigger events on the display screen, but in the second frame there is no trigger event at the specified trigger position, i.e., this waveform image is not ordinarily legal in a triggered mode of operation. If there are two drawing engines 20, the second drawing engine may draw a waveform image with the fourth trigger event at the specified trigger position, as shown in FIG. 3. By combining the outputs from the two drawing engines 20 as shown in FIG. 4, where the first drawing engine just draws the first frame and the second drawing engine draws an overlapping first frame, a composite waveform image is produced where every trigger event is displayed and a trigger event is always placed at the specified trigger position. The result is that the second and third trigger events are at two places, and the fact that there are only four trigger events is not clearly shown. But if the waveform window is widened to cover more time, then the four trigger events may be displayed in one waveform image.

Therefore preferably at least two drawing engines 20 are provided so that one drawing engine is ready to start drawing as soon as the other drawing engine gets into the second half of a waveform image. A trigger event that is just past the right side of the display window (corresponding to the display screen) of the first drawing engine is displayed at the specified trigger position by the second drawing engine. The further to the right the location of the specified trigger position is placed, the more drawing engines may be needed in order to draw every trigger event on the display screen. The outputs from the multiple drawing engines of the same channel are combined by an OR function 22 and input to a display buffer 24 together with the combination of outputs of other graphic drawing engines 26 and previous waveform images from the display buffer.

Although not shown in FIG. 1 for simplicity, for a measurement instrument having multiple input channels two or more channels may be drawn at the same time by duplicating the A/Ds 12, the data compression 16, the FIFO 18 and the drawing engines 20. The output from the display buffer 24 is provided on a display 28 at a display update rate.

Although the architecture described above generally allows all trigger events to be drawn on the display 28, there are conditions that may prevent this architecture from being able to draw all of the trigger events. As an example, the user may move the trigger position—the horizontal position on the display 28 where the trigger is to be displayed—to the right side of the display. When trigger events are rapid enough, some trigger events may not be displayed. When all of the drawing engines 20 are busy and trigger events still are being detected by the digital trigger circuit 14, a "missed trigger" indicator may be set. When the missed trigger indicator is not set, then a "100% Live" indicator may be shown on the display 28, assuring the user that all triggers are being displayed.

Also there are periods of time when no triggers are being generated, so no waveforms are being drawn to the display 28. To provide feedback to the user about the signal during these periods of time, a bar graph may be drawn at one end of the display 28 to show the signal activity when no trigger events are occurring. The bar graph may also show a summary of the activity shown on the display 28. A method for displaying waveforms is described in co-pending U.S. patent application Ser. No. 11/385,170 entitled "Waveform Compression and Display."

A packer 30 may be included between the data compressor 16 and the FIFO 18 to combine the data from the data compressor into larger data widths as a function of the type of data compression being performed on the digitized signal. Concurrently an unpacker 32 may be included between the FIFO 18 and the drawing engine 20 to recover the digitized signal. The unpacker 32 may include interpolation, if required. A controller 34 receives the trigger events from the digital trigger circuit 14 and controls the operation of the drawing engine 20 to assure that the pre-trigger and post-trigger data are included and the position of the trigger is positioned accurately.

Thus the present invention provides "no dead time" acquisition of an electrical signal by digitizing the signal, detecting all trigger events within the measurement instrument bandwidth from the digitized signal using a fast digital trigger circuit, delaying the digitized signal by a pre-trigger amount using a FIFO, using a custom drawing engine to draw an N-column wide portion of the waveform each clock cycle, and using double buffering so that more than one waveform image may be drawn at the same time to assure that, when combined, all trigger events are displayed.

What is claimed is:

1. A "no dead time" acquisition apparatus comprising:
    means for recognizing all trigger events within an electrical signal being monitored to produce a trigger signal;
    means for delaying a digitized signal representing the electrical signal for a predetermined time before a first trigger event in the trigger signal to produce a delayed digitized signal; and
    means for drawing a waveform for the delayed digitized signal in real time that includes all the trigger events within a display window;
    wherein the drawing means comprises:
        means for drawing multiple, overlapping waveform images associated with the trigger events, each waveform image having one of the trigger events at a specified trigger position within the display window; and
        means for combining the multiple, overlapping waveform images to produce the waveform in real time for the digitized signal; and
    further comprising means for indicating a missed trigger event that occurs for certain specified trigger positions within the display window.

2. The apparatus as recited in claim 1 further comprising means for displaying signal activity for the digitized signal when no trigger events occur.

3. The apparatus as recited in claim 1
    wherein said means for recognizing all trigger events includes a fast trigger generator having an electrical signal being monitored as an input and producing a trigger signal as an output, the trigger signal including all trigger events within the electrical signal;

said means for delaying includes a buffer having digital data from a digitized signal representing the electrical signal as an input and providing delayed digital data as an output to assure a predetermined amount of digital data is received prior to a first trigger event in the trigger signal; and said means for drawing includes a fast rasterizer having the delayed digital data as an input and producing a waveform image as an output, the waveform image being a graphical representation of the electrical signal.

4. The apparatus as recited in claim 3 further comprising a data compressor having the digitized signal as an input and having the digital data as an output to reduce the amount of data for storage without losing any significant features of the electrical signal.

5. The apparatus as recited in claim 3 wherein the fast rasterizer comprises:

a plurality of drawing engines, each having the delayed digital data as an input and providing an individual waveform image as an output, each individual waveform image having one of the trigger events at a specified trigger position within a display window and overlapping with another one of the individual waveform images; and means for combining the individual waveform images to form a composite waveform image as the waveform image output from the fast rasterizer, the composite waveform image including all of the trigger events.

6. A method of "no dead time" acquisition comprising the steps of:

recognizing all trigger events within an electrical signal being monitored to produce a trigger signal;

delaying a digitized signal representing the electrical signal for a predetermined time before a first trigger event in the trigger signal to produce a delayed digitized signal; and drawing a waveform for the delayed digitized signal in real time that includes all the trigger events within a display window;

wherein the drawing step comprises the steps of:

drawing multiple, overlapping waveform images associated with the trigger events, each waveform image having one of the trigger events at a specified trigger position within the display window; and combining the multiple, overlapping waveform images to produce the waveform for the digitized signal; and further comprising the step of indicating a missed trigger event that occurs for certain specified trigger positions within the display window.

7. The method as recited in claim 6 further comprising the step of displaying signal activity for the digitized signal when no trigger events occur.

* * * * *